United States Patent
Chen et al.

(10) Patent No.: US 11,177,459 B2
(45) Date of Patent: Nov. 16, 2021

(54) LIGHT-EMITTING ELEMENT ENCAPSULATION STRUCTURE, METHOD FOR FABRICATING THE SAME AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Shihlun Chen, Beijing (CN); Litao Qu, Beijing (CN)

(73) Assignees: Hefei Xinsheng Optoelectronics Technology Co., Ltd, Anhui (CN); BOE Technology Group Co., Ltd., Beijing (CN)

( * ) Notice: Subject to any disclaimer, the term of this patent is extended or adjusted under 35 U.S.C. 154(b) by 146 days.

(21) Appl. No.: 16/465,698

(22) PCT Filed: Nov. 22, 2018

(86) PCT No.: PCT/CN2018/117031
§ 371 (c)(1),
(2) Date: May 31, 2019

(87) PCT Pub. No.: WO2019/205611
PCT Pub. Date: Oct. 31, 2019

(65) Prior Publication Data
US 2020/0343486 A1 Oct. 29, 2020

(30) Foreign Application Priority Data

Apr. 24, 2018 (CN) .................. 201810375392.8

(51) Int. Cl.
*H01L 51/52* (2006.01)
*H01L 51/56* (2006.01)

(52) U.S. Cl.
CPC ...... *H01L 51/5259* (2013.01); *H01L 51/5253* (2013.01); *H01L 51/525* (2013.01); *H01L 51/56* (2013.01)

(58) Field of Classification Search
CPC . H01L 51/5259; H01L 51/5253; H01L 51/56; H01L 51/525; H01L 2251/301; H01L 51/52; H01L 51/44
(Continued)

(56) References Cited

U.S. PATENT DOCUMENTS

2008/0278965 A1* 11/2008 Huang ................ H01L 51/5243
257/678
2015/0362449 A1  12/2015 Suzuki
2019/0123302 A1  4/2019 Luo

FOREIGN PATENT DOCUMENTS

| CN | 105280675 A | 1/2016 |
| CN | 107799664 A | 3/2018 |

(Continued)

OTHER PUBLICATIONS

Chinese Office Action for counterpart 201810375392.8 dated Mar. 5, 2019.
(Continued)

*Primary Examiner* — Thinh T Nguyen
(74) *Attorney, Agent, or Firm* — Arent Fox LLP; Michael Fainberg (57) ABSTRACT

Disclosed are a light-emitting element encapsulation structure, a method for fabricating the same, and a display panel, and the light-emitting element encapsulation structure includes: a first substrate; a second substrate arranged opposite to the first substrate; a light-emitting element located on the side of the second substrate facing the first substrate; an encapsulation layer made of a water-absorbent material, and filled in edge areas of the first substrate and the second substrate, wherein a hermetic space is defined by the encap-
(Continued)

sulation layer, the first substrate, and the second substrate, and the light-emitting element is located in the hermetic space; and a filler; the hermetic space is full of the filler except for an area occupied by the light-emitting element.

14 Claims, 8 Drawing Sheets

(58) Field of Classification Search
USPC .......................... 257/40, 79; 438/82, 99, 22
See application file for complete search history.

(56) References Cited

FOREIGN PATENT DOCUMENTS

| | | |
|---|---|---|
| CN | 108598280 A | 9/2018 |
| JP | 2000030857 A | 1/2000 |

OTHER PUBLICATIONS

International Search Report for PCT/CN2018/117031 dated Feb. 27, 2019.
Chinese Office Action for counterpart 201810375392.8 dated Jul. 23, 2019.
Chinese Office Action for counterpart 201810375392.8 dated Oct. 23, 2019.

* cited by examiner

LIGHT-EMITTING ELEMENT ENCAPSULATION STRUCTURE, METHOD FOR FABRICATING THE SAME AND DISPLAY PANEL

This disclosure is a National Stage of International Application No. PCT/CN2018/117031, filed on Nov. 22, 2018, which claims the priority of Chinese Patent Application No. 201810375392.8, filed with the Chinese Patent Office on Apr. 24, 2018, and entitled "A light-emitting element encapsulation structure, a method for fabricating the same, and a display panel", both of which are hereby incorporated by reference in their entireties.

FIELD

This disclosure relates to the field of display technologies, and particularly to an encapsulation structure of a light-emitting element encapsulation structure, a method for fabricating the same, and a display panel.

BACKGROUND

An Organic Light-Emitting Diode (OLED) element has been widely applied in the industry of displays, but generally may be eroded by humidity, oxygen, etc., in the air, thus seriously degrading the performance of the OLED element, and shortening the service lifetime thereof, so the OLED element is generally encapsulated using an OLED encapsulation structure to be isolated from the humidity, oxygen, etc., in the air so as to alleviate the humidity, oxygen, etc., in the air from degrading the performance of the OLED element, and to prolong the service lifetime thereof.

SUMMARY

Some embodiments of this disclosure provide a light-emitting element encapsulation structure including:
  a first substrate;
  a second substrate arranged opposite to the first substrate;
  a light-emitting element located on a side of the second substrate facing the first substrate;
  an encapsulation layer made of a water-absorbent material, and filled in edge areas of the first substrate and the second substrate, wherein a hermetic space is defined by the encapsulation layer, the first substrate, and the second substrate, and the light-emitting element is located in the hermetic space; and
  a filler; the hermetic space is full of the filler except for an area occupied by the light-emitting element.

Optionally, in the light-emitting element encapsulation structure according to some embodiments of this disclosure, the distance between a orthographic projection of the encapsulation layer onto the first substrate, and a orthographic projection of the light-emitting element onto the first substrate is less than or equal to 0.5 mm.

Optionally, in the light-emitting element encapsulation structure according to some embodiments of this disclosure, the encapsulation layer is a sheet made of a glue material.

Optionally, in the light-emitting element encapsulation structure according to some embodiments of this disclosure, the encapsulation layer includes a water-absorbent material layer and a glue material layer, wherein:
  the glue material layer is between the water-absorbent material layer and the first substrate.

Optionally, in the light-emitting element encapsulation structure according to some embodiments of this disclosure, the material of the glue material layer includes epoxy resin and rubber resin, and the material of the water-absorbent material layer includes calcium oxide.

Optionally, in the light-emitting element encapsulation structure according to some embodiments of this disclosure, the encapsulation layer further includes a water-absorbent layer of color changing property located on the a of the water-absorbent material layer away from the first substrate.

Optionally, in the light-emitting element encapsulation structure according to some embodiments of this disclosure, the material of the transparent filler includes a water-absorbent material.

Some embodiments of this disclosure further provide a method for fabricating a light-emitting element encapsulation structure, the method including:
  bonding an encapsulation layer in an edge area of a first substrate, wherein the material of the encapsulation layer includes a water-absorbent material;
  filling a transparent filler in a semi-hermetic area defined by the first substrate and the encapsulation layer; and
  aligning and fitting the first substrate with a second substrate including a light-emitting element.

Optionally, in the method for fabricating a light-emitting element encapsulation structure according to some embodiments of this disclosure, the bonding the encapsulation layer in the edge area of the first substrate includes:
  bonding a first protective film and a second protective film respectively on upper and lower surfaces of the encapsulation layer;
  placing the encapsulation layer bonded with the first protective film and the second protective film into grooves of a jig, wherein the second protective film comes into contact with the bottoms of the grooves;
  removing the first protective film of the encapsulation layer;
  aligning and fitting the jig carrying the encapsulation layer with the first substrate; and
  removing the jig.

Optionally, in the method for fabricating a light-emitting element encapsulation structure according to some embodiments of this disclosure, the aligning and fitting the first substrate with the second substrate including the light-emitting element includes:
  removing the second protective film; and
  aligning and fitting the first substrate bonded with the encapsulation layer and filled with the transparent filler, with the second substrate.

Optionally, in the method for fabricating a light-emitting element encapsulation structure according to some embodiments of this disclosure, after the first substrate is aligned and fit with the second substrate including the light-emitting element, the method further includes:
  thermally pressing and fitting, and thermally curing the encapsulation layer between the first substrate and the second substrate aligned and fit with each other.

Some embodiments of this disclosure further provide a display device including the light-emitting element encapsulation structure according to any one of the embodiments above of this disclosure.

DETAILED DESCRIPTION OF THE EMBODIMENTS

In order to make the objects, technical solutions, and advantages of embodiments of this disclosure more apparent, the technical solutions according to embodiments of this disclosure will be described below clearly and fully with reference to the drawings in embodiments of this disclosure. Apparently the embodiments to be described are only a part not all of the embodiments of this disclosure. Based upon the embodiments here of this disclosure, all of other embodiments which can occur to those ordinarily skilled in the art without any inventive effort shall come into the scope of this disclosure as claimed.

Unless defined otherwise, technical terms or scientific terms throughout this disclosure shall convey their usual meaning as appreciated by those ordinarily skilled in the art to which this disclosure pertains. The terms "first", "second", or the like throughout this disclosure do not suggest any order, number or significance, but is only intended to distinguish different components from each other. Alike the terms "include", "comprise", or the like refer to that an element or an item preceding to the term encompasses an element(s) or an item(s) succeeding to the term, and its (or their) equivalence(s), but shall not preclude another element(s) or item(s). The term "connect", "connected", or the like does not suggest physical or mechanical connection, but may include electrical connection no matter whether it is direct or indirect. The terms "above", "below", "left", "right", etc., are only intended to represent a relative positional relationship, and when the absolute position of an object as described is changed, the relative positional relationship may also be changed accordingly.

For the sake of clarity and conciseness of the following description of the embodiments of this disclosure, a detailed description of known functions and components will be omitted in this disclosure.

Figure 1:
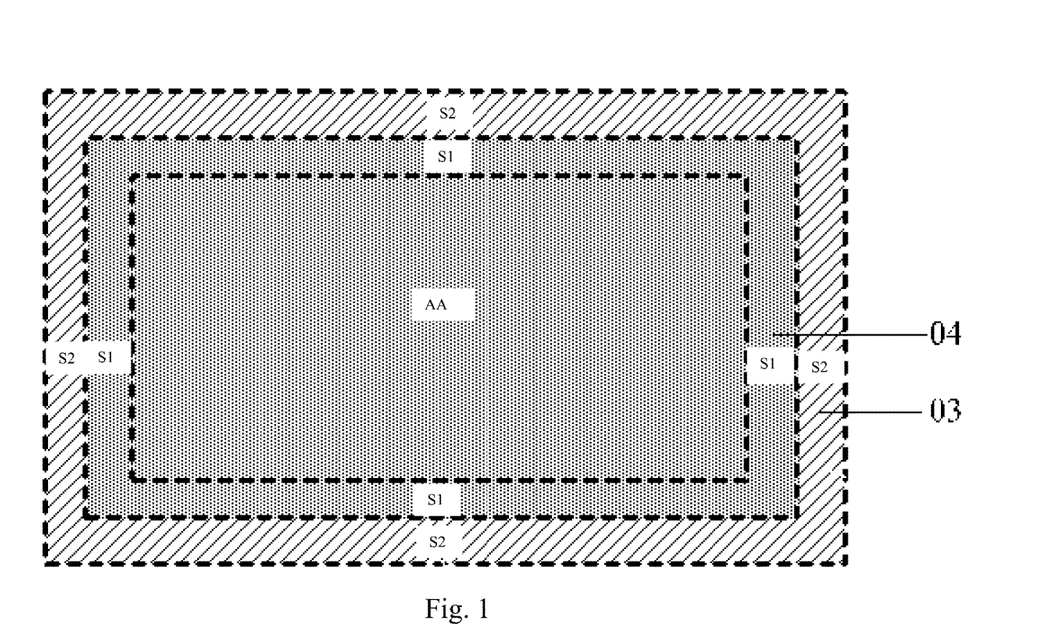
FIG. 1 is a schematic structural diagram of a glass package encapsulation structure in the related art in a top view.
Figure 2:
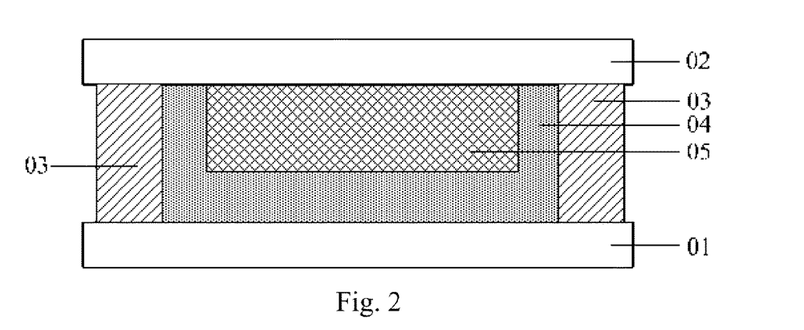
FIG. 2 is a schematic structural diagram of the glass package encapsulation structure in the related art in a sectional view.

In the related art, a light-emitting element is generally encapsulated using glass package, and as illustrated in FIG. 1 and FIG. 2 which are schematic structural diagrams of a light-emitting element encapsulation structure of glass package in the related art in a top view and a corresponding sectional view, the light-emitting element encapsulation structure includes: a display area AA (in the innermost dotted box, i.e., an orthographic projection of a light-emitting element 05 onto a first substrate 01), a first peripheral area S1 located around the display area AA and surrounding the display area AA (in a first dotted box around the area AA), and a second peripheral area S2 located around the first peripheral area S1 and surrounding the first peripheral area S1 (in a second dotted box around the area AA). In the related art, in order to encapsulate the light-emitting element using glass package, in order to avoid an encapsulation layer 03 from affecting the other layers, the encapsulation layer 03 is only fit in the outermost second peripheral area S2 of the first substrate 01 (in the box filled with slants), a filler 04 is filled in a semi-hermetic space defined by the encapsulation layer 03 and the first substrate 01, and then a second substrate 02 arranged with the light-emitting element 05 is aligned and fit with the first substrate 01. Since the material of the encapsulation layer 03 in use is generally epoxy resin, the encapsulation layer 03 can only be coated in the second peripheral area S2 of the first substrate 01, and the width thereof shall not be larger, so that lines or the other layers on the second substrate 02 will not be affected. Moreover, there is such limited hermetic performance of the encapsulation layer 03 that ambient humidity, oxygen, etc., tends to enter the light-emitting element encapsulation structure through the encapsulation layer 03 on the sides thereof, thus shortening the service lifetime of the light-emitting element.

Figure 3:
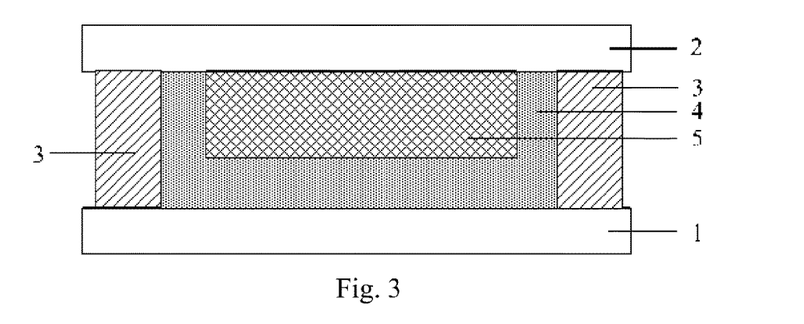
FIG. 3 is a schematic structural diagram of a light-emitting element encapsulation structure according to some embodiments of this disclosure in a sectional view.

In view of the problem above in the related art, some embodiments of this disclosure provides a light-emitting element encapsulation structure as illustrated in FIG. 3, which includes:

a first substrate 1;
a second substrate 2 arranged opposite to the first substrate; 1;
a light-emitting element 5 located on the side of the second substrate 2 facing the first substrate 1;

an encapsulation layer 3 made of a water-absorbent material, and filled in edge areas of the first substrate 1 and the second substrate 2, where a hermetic space is defined by the encapsulation layer 3, the first substrate 1, and the second substrate 2, and the light-emitting element 5 is located in the hermetic space; and a transparent filler 4 of which the hermetic space is full.

Optionally, in the light-emitting element encapsulation structure according to some embodiments of this disclosure, the encapsulation layer is arranged in the edge areas of the first substrate and the second substrate, and the encapsulation layer is made of the water-absorbent material; and since ambient humidity, oxygen, etc., generally enters the light-emitting element from the sides of the encapsulation structure of the light-emitting element, the first substrate and the second substrate are filled with the encapsulation layer including at least the water-absorbent material in some embodiments of this disclosure so that the ambient humidity, oxygen, etc., can be further prevented from entering the light-emitting element from the sides of the encapsulation structure, so as to prolong the service lifetime of the light-emitting element. Furthermore the film overlying the light-emitting element is a transparent filler, and in this structure, the light-emitting element can be embodied as a top-emitting element.

Figure 4:
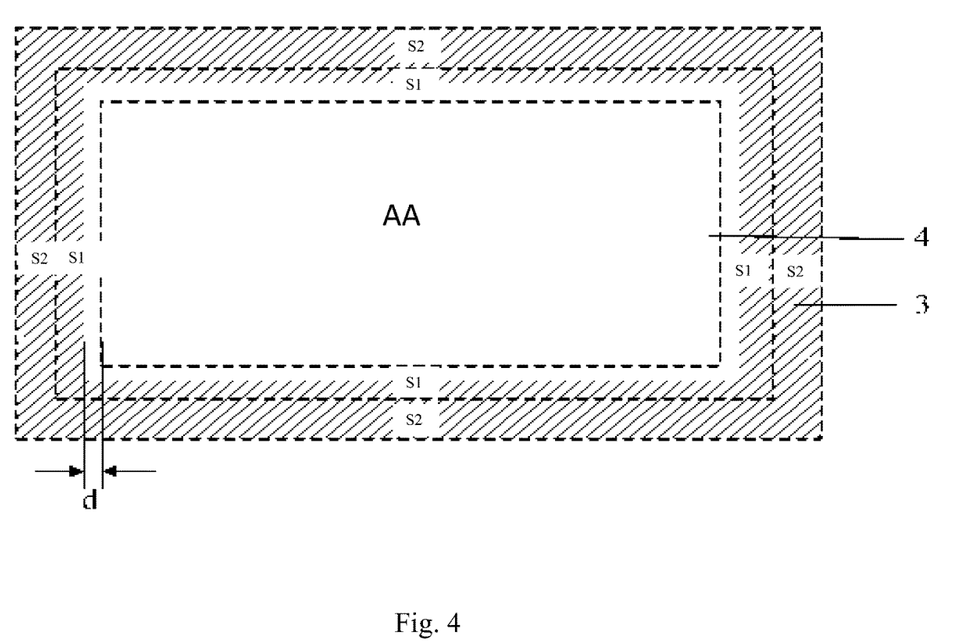
FIG. 4 is a schematic structural diagram of the light-emitting element encapsulation structure before an encapsulation layer is pressed and fit according to some embodiments of this disclosure in a top view.

Optionally, in the light-emitting element encapsulation structure according to some embodiments of this disclosure, as illustrated in FIG. 3 and FIG. 4, the light-emitting element encapsulation structure can include a display area AA (an area including an orthographic projection of the light-emitting element 5 onto the first substrate 01), a first peripheral area S1 located around the display area AA and surrounding the display area AA, and a second peripheral area S2 located around the first peripheral area S1 and surrounding the first peripheral area S1, where a non-display area can optionally include the first peripheral area S1 and the second peripheral area S2, and the encapsulation layer 3 is arranged in the non-display area, and can optionally be only arranged in a part of the non-display area, e.g., in the second peripheral area S2, or can be arranged in both the second peripheral area S2, and a part of the first peripheral area S1.

Optionally, in the light-emitting element encapsulation structure according to some embodiments of this disclosure, as illustrated in FIG. 3 and FIG. 4, the distance d between an orthographic projection of the encapsulation layer 3 onto the first substrate 1, and an orthographic projection of the light-emitting element 5 onto the first substrate 1 is less than or equal to 0.5 mm.

Optionally, in the light-emitting element encapsulation structure according to some embodiments of this disclosure, as illustrated in FIG. 3 and FIG. 4, the encapsulation layer 3 occupies the second peripheral area S2, and a part of the first peripheral area S1, and there is only a short distance d between the orthographic projection of the encapsulation layer 3 onto the first substrate 1, and the orthographic projection of the light-emitting element 5 onto the first substrate 1, thus greatly increasing the width of the encapsulation layer 3, and improving the resistance of the encapsulation layer 3 to humidity and oxygen.

Optionally, in the light-emitting element encapsulation structure according to some embodiments of this disclosure, as illustrated in FIG. 3 and FIG. 4, the distance d between the orthographic projection of the encapsulation layer 3 onto the first substrate 1, and the orthographic projection of the light-emitting element 5 onto the first substrate 1 can range from 0.1 mm to 0.5 mm, and optionally 0.5 mm. In this way, the encapsulation layer 3 can be avoided from overlapping with the display area AA while the first substrate 1 is being pressed and fit with the second substrate 2, and also a gap can be avoided from existing between the encapsulation layer 3 and the transparent filler 4 due to a larger distance d after the substrates are pressed and fit with each other, which would otherwise have degraded the encapsulation effect.

Figure 5:
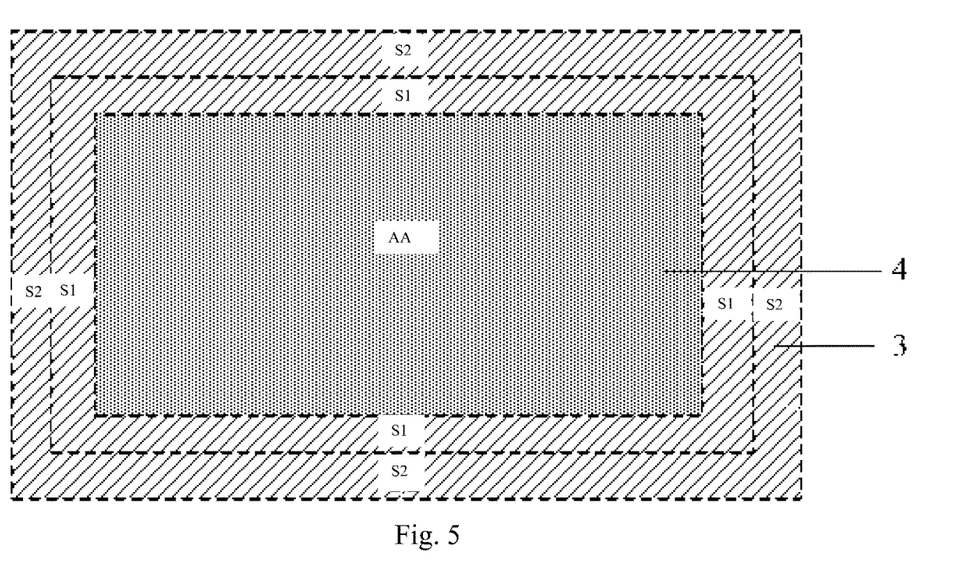
FIG. 5 is a schematic structural diagram of the light-emitting element encapsulation structure after the encapsulation layer is pressed and fit according to some embodiments of this disclosure in a top view.
Figure 6:
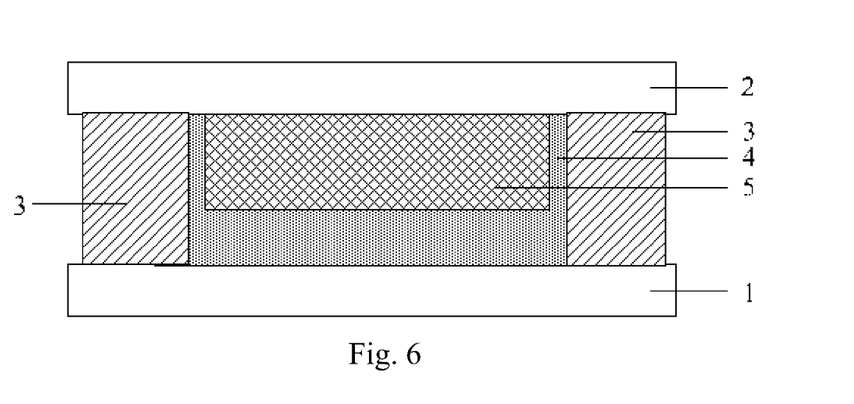
FIG. 6 is a schematic structural diagram of the light-emitting element encapsulation structure after being pressed and fit according to some embodiments of this disclosure in a sectional view.

It shall be noted that in the light-emitting element encapsulation structure according to some embodiments of this disclosure, as illustrated in FIG. 4 to FIG. 6, there is some distance between the orthographic projection of the encapsulation layer 3 onto the first substrate 1, and the orthographic projection of the light-emitting element 5 onto the first substrate 1, that is, when the encapsulation layer 3 is bonded on the side of the first substrate 1 facing the second substrate 2, there is some distance d between the orthographic projection of the encapsulation layer 3 onto the first substrate 1, and the orthographic projection of the light-emitting element 5 onto the first substrate 1, but after the first substrate 1 is aligned, pressed, and fit with the second substrate 2, as illustrated in FIG. 5 and FIG. 6, the encapsulation layer 3 and the transparent filler 4 are expanded upon being pressed, so the distance between the orthographic projection of the encapsulation layer 3 onto the first substrate 1, and the orthographic projection of the light-emitting element 5 onto the first substrate 1 is shortened, and thus the encapsulation layer 3 is joined seamlessly with the transparent filler 4, thus better encapsulating the light-emitting element 5.

Moreover, the tolerance to granules can be improved due to a significant substrate spacing (the spacing between the first substrate and the second substrate), but when the substrate spacing is increased in the encapsulation structure of the light-emitting element in the related art, the glue material of the encapsulation layer with limited anti-washout performance tends to be washed out, and although the washout problem can be prevented by improving the viscosity of the glue material, and increasing the width thereof, the glue material with the improved viscosity may not be broken off, thus increasing the process difficulty, and the encapsulation layer with the increased width of the glue material may extend onto another film, thus resulting in a risk of damaging the other film. In the light-emitting element encapsulation structure according to some embodiments of this disclosure, the encapsulation layer can extend into the first peripheral area, and cover a large area, so there is a good anti-washout effect, and thus the substrate spacing can be increased to thereby improve the tolerance of the display panel to granules while avoiding the washout problem from occurring in the display panel due to an increase in substrate spacing.

Optionally, in the light-emitting element encapsulation structure according to some embodiments of this disclosure, the encapsulation layer is a sheet made of a glue material.

Optionally, the encapsulation layer in the related art is made of a formulated viscous glue material in an irregular shape; and the encapsulation layer in some embodiments of this disclosure is a sheet made of a glue material, which can be arranged so that the encapsulation layer has a larger width, and a larger contact area with another film, so there will be a more uniform force-accepting area upon being pressed and fit under the same pressure to thereby avoid the other film from being damaged upon being pressed and fit.

Figure 7:
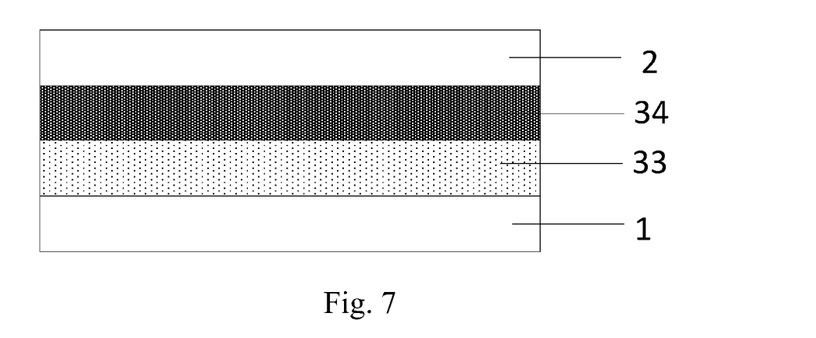
FIG. 7 is a schematic structural diagram of an edge area of the light-emitting element encapsulation structure according to some embodiments of this disclosure in a sectional view.

Optionally, in the light-emitting element encapsulation structure according to some embodiments of this disclosure, as illustrated in FIG. 7, the encapsulation layer 3 includes a water-absorbent material layer 33 and a glue material layer 34.

The glue material layer 34 is located between the water-absorbent material layer 33 and the second substrate.

Optionally, in the light-emitting element encapsulation structure according to some embodiments of this disclosure, the glue material layer is located between the water-absorbent material layer and the second substrate, that is, the water-absorbent material layer is located on the side of the glue material layer away from the second substrate, so the water-absorbent material layer is generally made of calcium oxide or another water-absorbent material, and shall be arranged away from the second substrate (on which a line for controlling the light-emitting element is arranged) to thereby avoid the line on the second substrate from being affected.

Figure 8:
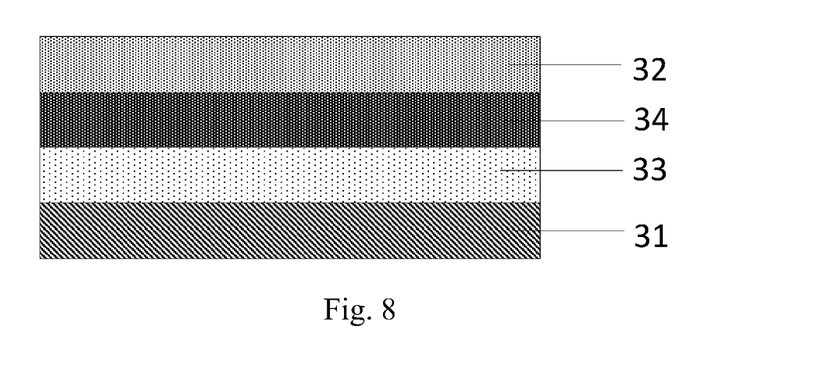
FIG. 8 is a schematic structural diagram of the encapsulation layer according to some embodiments of this disclosure in a sectional view.

Here before the encapsulation layer is fit with the first substrate and the second substrate, as illustrated in FIG. 8, a first protective film 31 is fit on the side of the water-absorbent material layer 33 away from the glue material layer 34, and a second protective film 32 is fit on the side of the glue material layer 34 away from the water-absorbent material layer 33.

Optionally, in the light-emitting element encapsulation structure according to some embodiments of this disclosure, the material of the glue material layer includes epoxy resin and rubber resin, and the material of the water-absorbent material layer includes calcium oxide.

Optionally, the traditional glue material generally includes epoxy resin, and is rigid, so it tends to damage another film after being cured, and for example, it may damage an OLED film (e.g., an EL organic film, a cathode Al film, etc.), a CVD film, etc., so the traditional glue material can only be located in the outermost edge areas of the first substrate and the second substrate (e.g., the second peripheral area), and it has a small width so as not to damage the other film. In some embodiments of this disclosure, the material of the glue material layer includes epoxy resin and rubber resin, and is soft, so it will not damage any other film. Accordingly in some embodiments of this disclosure, the width of the glue material can be set large (cover both the first peripheral area and the second peripheral area) to thereby improve the resistance thereof to humidity and oxygen.

Optionally, in the light-emitting element encapsulation structure according to some embodiments of this disclosure, the encapsulation layer further includes a water-absorbent layer of color changing property located on the side of the water-absorbent material layer away from the second substrate.

Optionally, in the light-emitting element encapsulation structure according to some embodiments of this disclosure, the water-absorbent layer of color changing property can be arranged to improve the waterproof performance of the encapsulation layer, and since the color of the water-absorbent layer of color changing property will vary after it absorbs water, a humidity penetration path can be determined more intuitively to thereby analyze a reason for a failure of the encapsulation layer, and determine when it may fail.

Optionally in the light-emitting element encapsulation structure according to some embodiments of this disclosure, the material of the transparent filler includes a water-absorbent material.

Optionally, in the light-emitting element encapsulation structure according to some embodiments of this disclosure, a transparent filler is arranged between the light-emitting element and the first substrate, and the transparent filler can be made of a glue material, or another water-absorbent material with a high transmittivity to thereby prevent humidity and oxygen from eroding the light-emitting element, but also planarize them, and make the display area and the peripheral areas uniform in thickness while increasing the substrate spacing. An orthographic projection of the transparent filler onto the first substrate covers at least the orthographic projection of the light-emitting element onto the first substrate.

Figure 9:
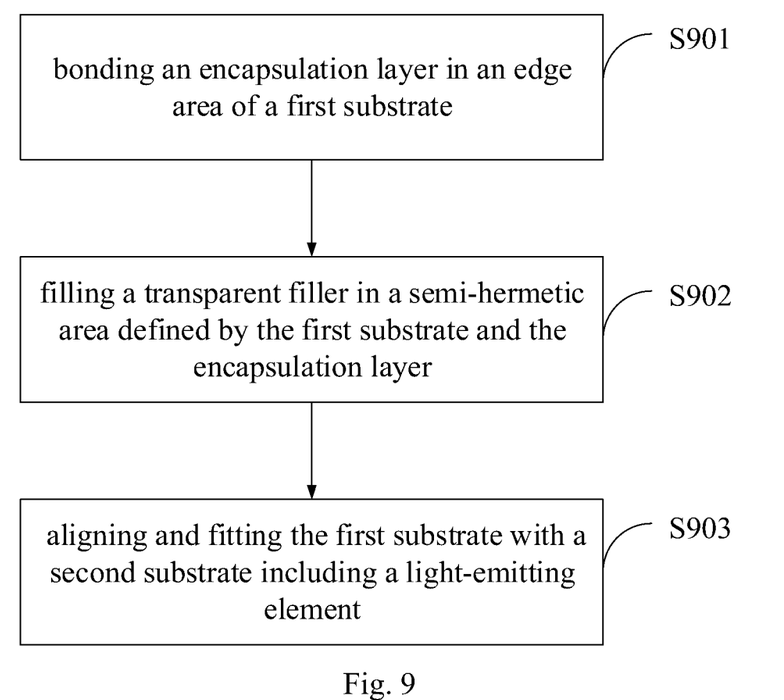
FIG. 9 is a schematic flow chart of fabricating the light-emitting element encapsulation structure according to some embodiments of this disclosure.

Based upon the same inventive idea, as illustrated in FIG. 9, some embodiments of this disclosure further provides a method for fabricating a light-emitting element encapsulation structure, where the method includes the following steps.

The step S901 is to bond an encapsulation layer in an edge area of a first substrate, where the material of the encapsulation layer includes a water-absorbent material.

Optionally, bonding the encapsulation layer in the edge area of the first substrate includes:
  bonding a first protective film and a second protective film respectively on upper and lower surfaces of the encapsulation layer;
  placing the encapsulation layer bonded with the first protective film and the second protective film into grooves of a jig, where the second protective film comes into contact with the bottoms of the grooves;
  removing the first protective film of the encapsulation layer;
  aligning and fitting the jig carrying the encapsulation layer with the first substrate; and
  removing the jig.

Optionally, in the light-emitting element encapsulation structure according to some embodiments of this disclosure, the encapsulation layer can be fit on the first substrate through the jig including the grooves to thereby avoid the narrow strip-shaped encapsulation layer from failing to be bonded, and the precision from being difficult to control.

The step S902 is to fill a transparent filler in a semi-hermetic area defined by the first substrate and the encapsulation layer.

The step S903 is to align and fit the first substrate with a second substrate including a light-emitting element.

Optionally, aligning and fitting the first substrate with the second substrate including the light-emitting element includes:
  removing the second protective film; and
  aligning and fitting the first substrate bonded with the encapsulation layer and filled with the transparent filler, with the second substrate.

Optionally, after the first substrate is aligned and fit with the second substrate including the light-emitting element, the method further includes:
  thermally pressing and fitting, and thermally curing the encapsulation layer between the first substrate and the second substrate aligned and fit with each other.

In order to make the method for fabricating a light-emitting element encapsulation structure according to some embodiments of this disclosure more apparent, the method for fabricating a light-emitting element encapsulation structure according to some embodiments of this disclosure will be described below in details with reference to FIG. 10 to FIG. 17, where a plurality of light-emitting elements are encapsulated concurrently using a jig according to some embodiments of this disclosure.

Figure 10:
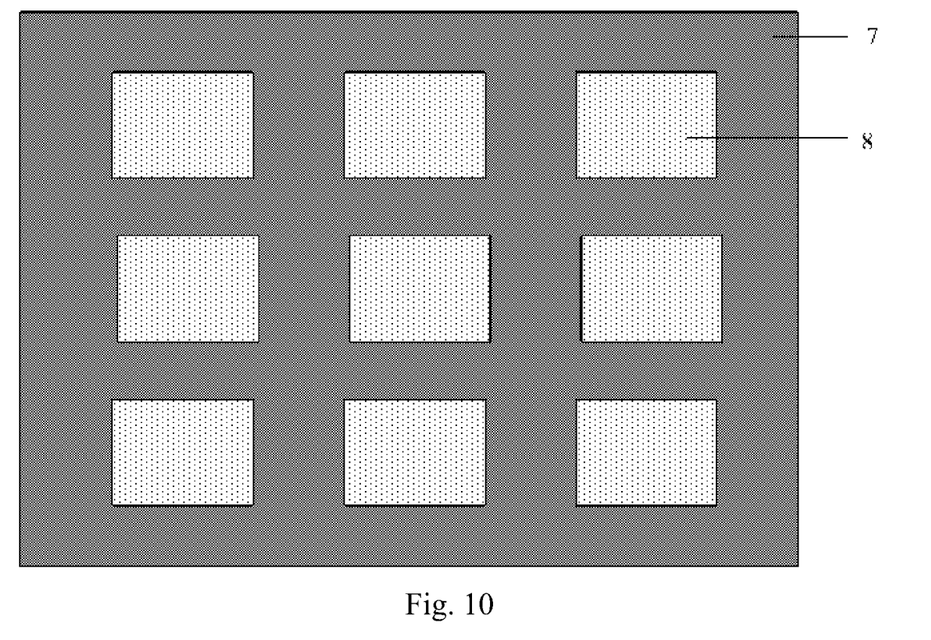
FIG. 10 is a schematic diagram of a jig including grooves according to some embodiments of this disclosure.

As illustrated in FIG. 10, a jig 7 including grooves 8 is prepared.

Figure 11:
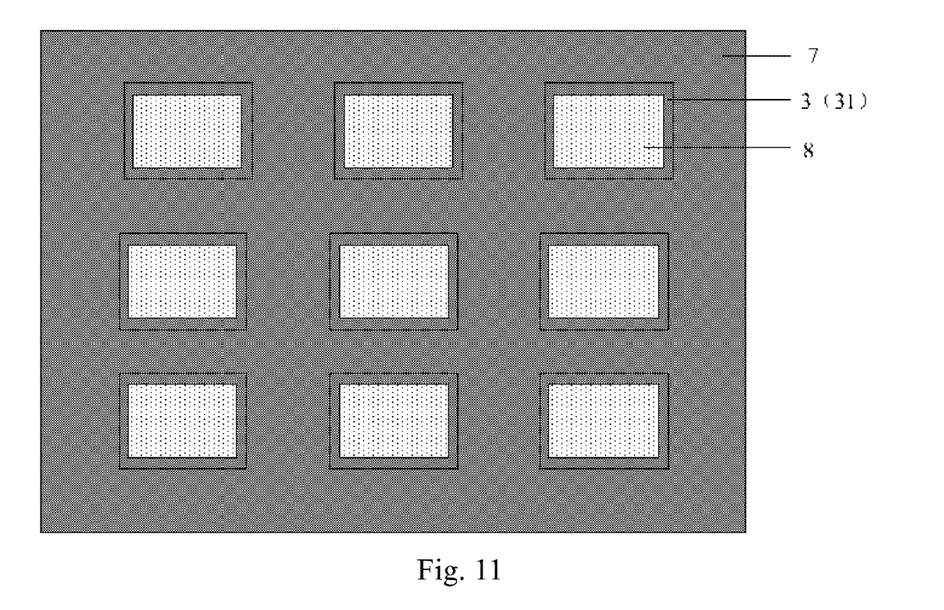
FIG. 11 is a schematic structural diagram after the encapsulation layer is placed on the jig according to some embodiments of this disclosure.

As illustrated in FIG. 11, the encapsulation layer 3 bonded with the first protective film 31 and the second protective film 32 is placed into the grooves 8 of the jig 7, and the second protective film 32 comes into contact with the bottoms of the grooves 8. It shall be noted that one or more light-emitting elements can be encapsulated concurrently in a particular fabrication process, although some embodiments of this disclosure will not be limited thereto.

Figure 12:
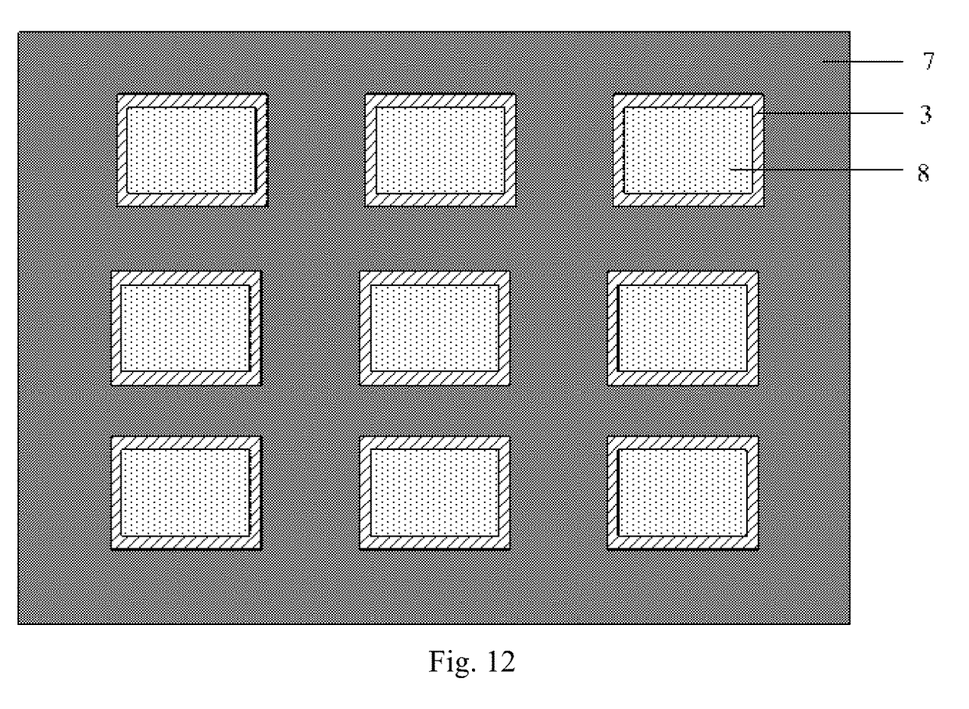
FIG. 12 is a schematic structural diagram of the encapsulation layer placed on the jig after a first protective film of the encapsulation layer is removed according to some embodiments of this disclosure.

As illustrated in FIG. 12, the first protective film 31 of the encapsulation layer is removed.

Figure 13:
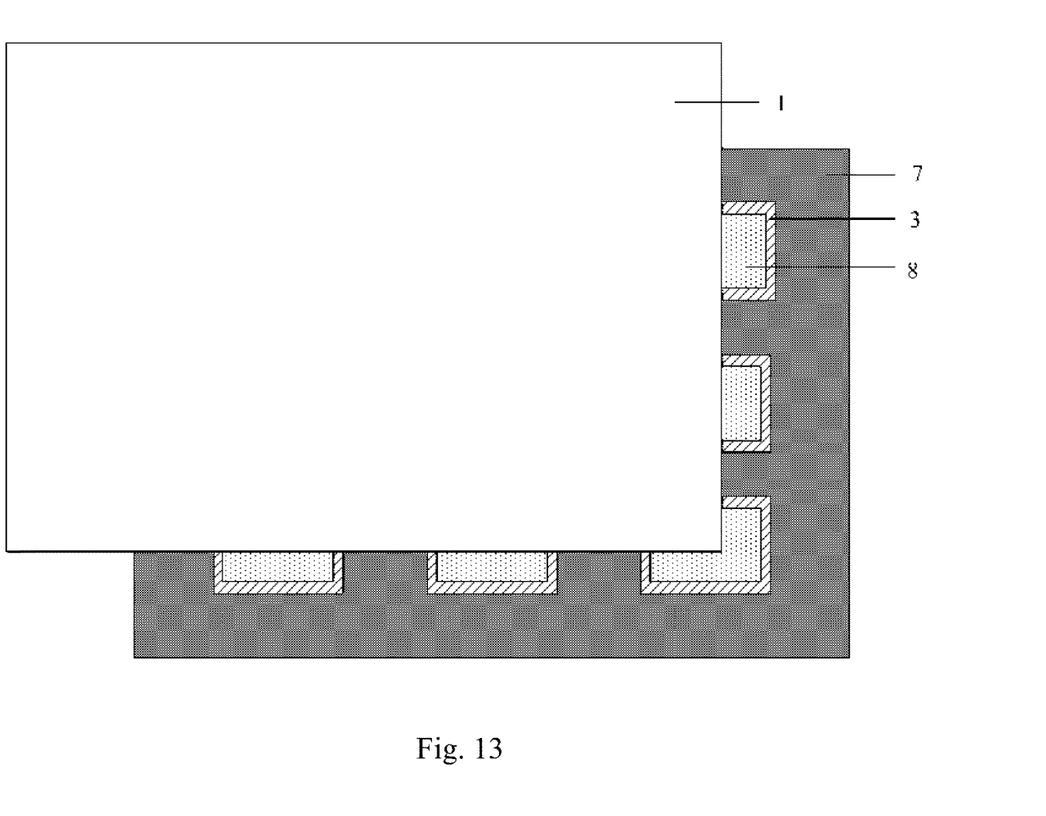
FIG. 13 is a schematic structural diagram of the jig aligned and fit with a first substrate according to some embodiments of this disclosure.

As illustrated in FIG. 13, the jig 7 carrying the encapsulation layer 3 is aligned and fit with the first substrate 1 (which can optionally be a glass package substrate).

Figure 14:
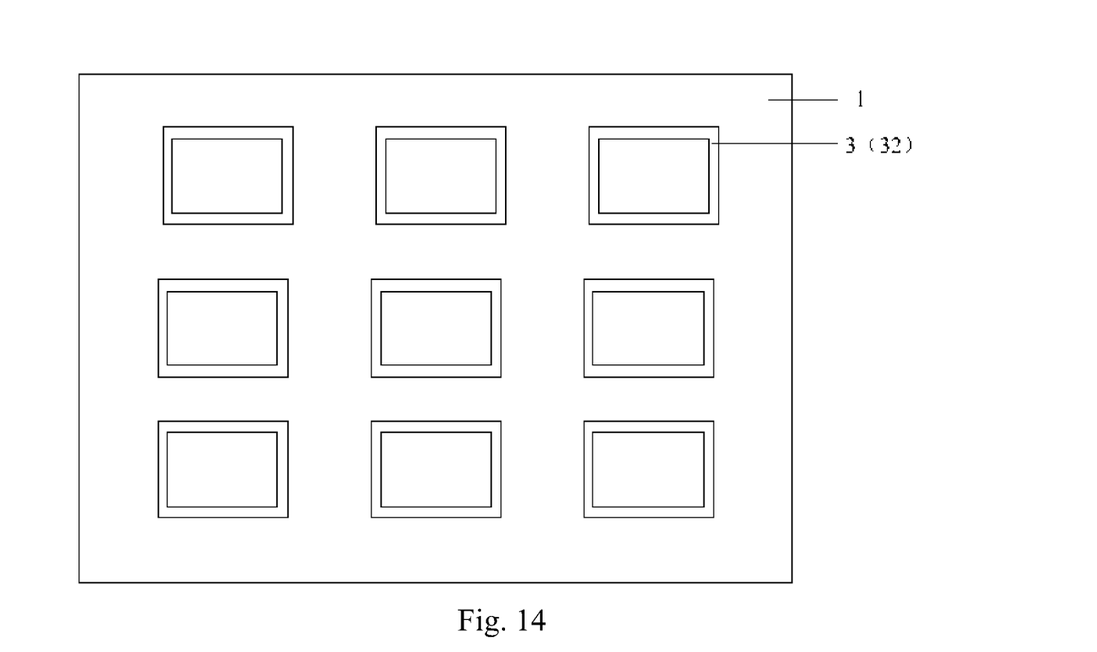
FIG. 14 is a schematic structural diagram after the jig is removed according to some embodiments of this disclosure.

As illustrated in FIG. 14, the jig 7 is removed, and the first substrate 1 is flipped.

Figure 15:
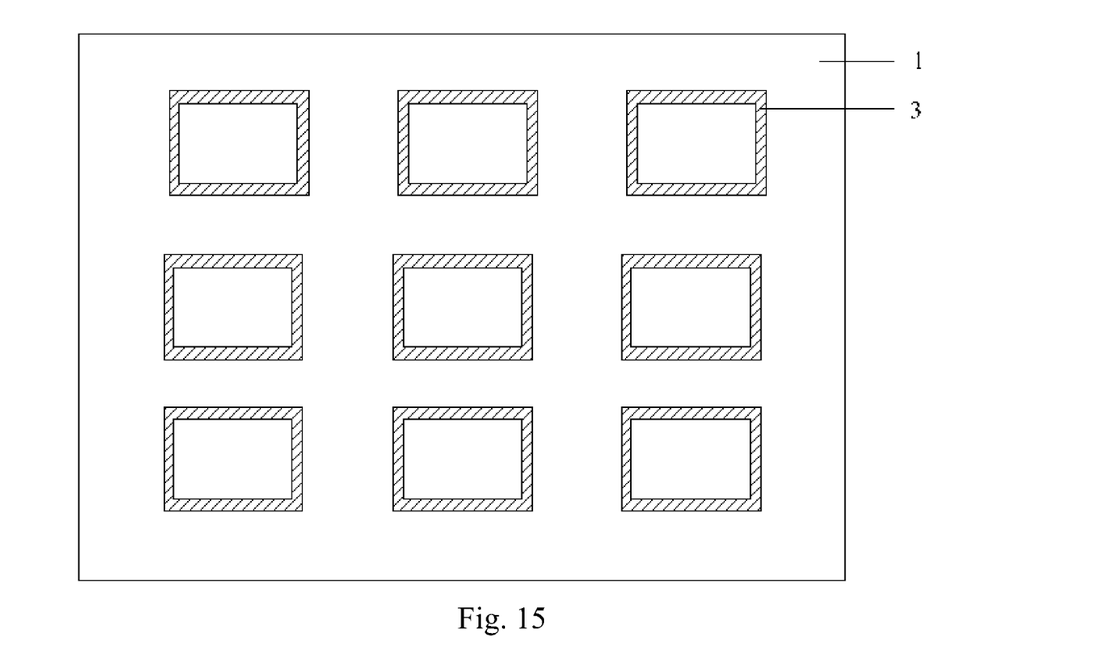
FIG. 15 is a schematic structural diagram after a second protective film of the encapsulation layer is removed according to some embodiments of this disclosure.

As illustrated in FIG. 15, the second protective film 32 is removed.

Figure 16:
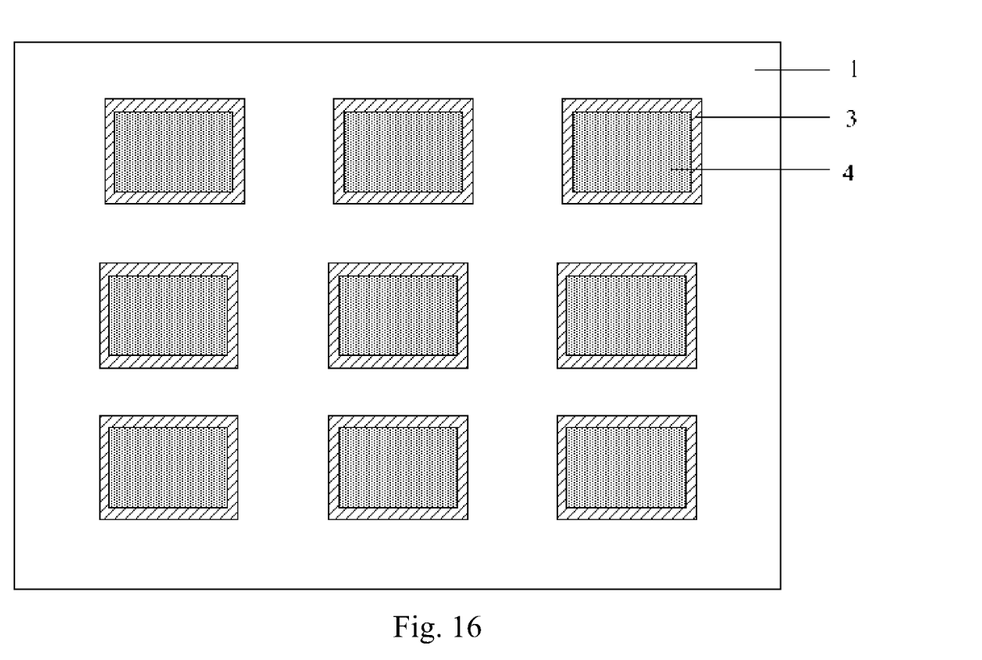
FIG. 16 is a schematic structural diagram of the first substrate filled with a transparent filler according to some embodiments of this disclosure.

As illustrated in FIG. 16, the transparent filler 4 is filled in the semi-hermetic area defined by the first substrate 1 and the encapsulation layer 3.

Figure 17:
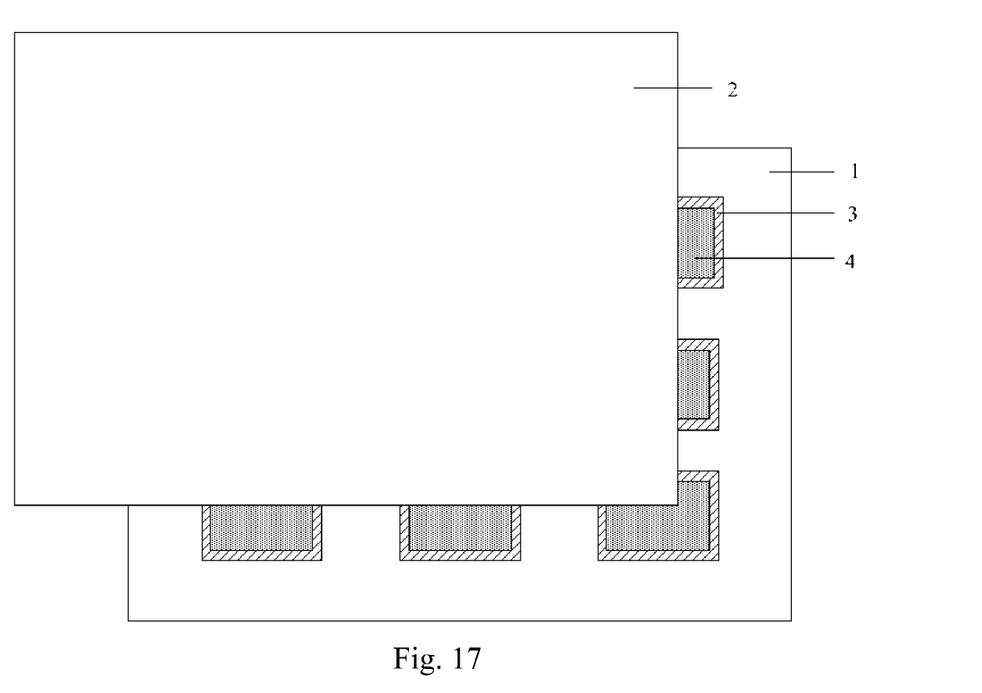
FIG. 17 is a schematic structural diagram of the first substrate aligned and fit with a second substrate according to some embodiments of this disclosure.

As illustrated in FIG. 17, the first substrate 1 is aligned with the second substrate 2 including the light-emitting element.

Optionally, after the first substrate is aligned and fit with the second substrate, the encapsulation layer between the first substrate and the second substrate shall be further thermally pressed and thermally cured.

In a real test, the encapsulation layer was tested 85/85 522h for reliability test, where water penetrated it over the distance of 2.44 mm, and after the coverage area of the encapsulation layer in some embodiments of this disclosure is extended, the width thereof was increased from the original width thereof of 3 mm to at least 5 mm, so the reliability could theoretically exceed that in the 85/85 522h test, and be far above that in a customer required 85/85 250h test.

Based upon the same inventive idea, some embodiments of this disclosure further provides a display panel including a plurality of light-emitting element encapsulation structures arranged in an array.

Here an implementation and an implementation principle of the display panel are substantially the same as the implementation and the implementation principle of the light-emitting element encapsulation structure above, so reference can be made to some embodiments of the light-emitting element encapsulation structure for a particular implementation of the display panel, so a repeated description thereof will be omitted here.

In the light-emitting element encapsulation structure, the method for fabricating the same, and the display panel according to the embodiments of this disclosure, the encapsulation layer is arranged in the edge areas of the first substrate and the second substrate in the light-emitting element encapsulation structure, where the encapsulation layer is made of the water-absorbent material; and since ambient humidity, oxygen, etc., generally enters the light-emitting element from the sides of the encapsulation structure of the light-emitting element, the first substrate and the second substrate are filled with the encapsulation layer including at least the water-absorbent material in some embodiments of this disclosure so that the ambient humidity, oxygen, etc., can be further prevented from entering the light-emitting element from the sides of the encapsulation structure, so as to prolong the service lifetime of the light-emitting element. Furthermore the film overlying the light-emitting element is a transparent filler, and in this structure, the light-emitting element can be embodied as a top-emitting element.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A light-emitting element encapsulation structure, comprising:
   a first substrate;
   a second substrate arranged opposite to the first substrate;
   a light-emitting element located on a side of the second substrate facing the first substrate;
   an encapsulation layer made of a water-absorbent material, and filled in edge areas of the first substrate and the second substrate, wherein a hermetic space is defined by the encapsulation layer, the first substrate, and the second substrate, and the light-emitting element is in the hermetic space; and
   a filler; the hermetic space is full of the filler except for an area occupied by the light-emitting element;
   wherein the encapsulation layer is a sheet made of a glue material and the encapsulation layer comprises:
   a water-absorbent material layer;
   a glue material layer located on a side, facing the first substrate, of the water-absorbent material layer; and
   a water-absorbent layer of color changing property located on a side of the water-absorbent material layer away from the first substrate;
   wherein in a direction parallel to the first substrate, an end in of the water-absorbent material layer is in contact with the filling layer, and the other end of the water-absorbent material layer is contact with air.

2. The light-emitting element encapsulation structure according to claim 1, wherein a distance between a short side of an orthographic projection of the encapsulation layer onto the first substrate and a short side of an orthographic projection of the light-emitting element onto the first substrate is less than or equal to 0.5 mm.

3. The light-emitting element encapsulation structure according to claim 1, wherein the encapsulation layer is made of a glue material.

4. The light-emitting element encapsulation structure according to claim 3, wherein
the glue material layer is between the water-absorbent material layer and the first substrate.

5. The light-emitting element encapsulation structure according to claim 4, wherein a material of the glue material layer comprises epoxy resin and rubber resin, and a material of the water-absorbent material layer comprises calcium oxide.

6. The light-emitting element encapsulation structure according to claim 1, wherein a material of the filler comprises a water-absorbent material.

7. A display panel, comprising a plurality of light-emitting element encapsulation structures according to claim 1, which are arranged in an array.

8. The display panel according to claim 7, wherein a distance between a short side of an orthographic projection of the encapsulation layer onto the first substrate and a short side of an orthographic projection of the light-emitting element onto the first substrate is less than or equal to 0.5 mm.

9. The display panel according to claim 7, wherein the encapsulation layer is made of a glue material.

10. The display panel according to claim 9, wherein
the glue material layer is between the water-absorbent material layer and the first substrate.

11. The display panel according to claim 10, wherein a material of the glue material layer comprises epoxy resin and rubber resin, and a material of the water-absorbent material layer comprises calcium oxide.

12. The display panel according to claim 7, wherein a material of the filler comprises a water-absorbent material.

13. The display panel according to claim 7, wherein the filter is substantially transparent.

14. The light-emitting element encapsulation structure according to claim 1, wherein the filter is substantially transparent.

* * * * *